US010796973B2

(12) United States Patent
Yang et al.

(10) Patent No.: US 10,796,973 B2
(45) Date of Patent: Oct. 6, 2020

(54) TEST STRUCTURES CONNECTED WITH THE LOWEST METALLIZATION LEVELS IN AN INTERCONNECT STRUCTURE

(71) Applicant: GLOBALFOUNDRIES Inc., Grand Cayman (KY)

(72) Inventors: Mankyu Yang, Fishkill, NY (US); Vara Govindeswara Reddy Vakada, San Jose, CA (US); Edward Maciejewski, Waterford, NY (US); Brian Greene, Portland, OR (US); Atsushi Ogino, Fishkill, NY (US); Vikrant Chauhan, Cohoes, NY (US); Prianka Sengupta, Malta, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 16/425,387

(22) Filed: May 29, 2019

(65) Prior Publication Data

US 2020/0152531 A1    May 14, 2020

Related U.S. Application Data

(63) Continuation-in-part of application No. 16/185,696, filed on Nov. 9, 2018.

(51) Int. Cl.
*H01L 29/423*     (2006.01)
*H01L 21/66*      (2006.01)
(Continued)

(52) U.S. Cl.
CPC .......... *H01L 22/32* (2013.01); *G01R 31/2621* (2013.01); *H01L 22/34* (2013.01); *H01L 23/528* (2013.01); *H01L 23/5226* (2013.01)

(58) Field of Classification Search
CPC . H01L 22/32; H01L 21/76895; H01L 23/528; H01L 29/772
(Continued)

(56) References Cited

U.S. PATENT DOCUMENTS 6,362,638 B1    3/2002   Ashton et al.
7,719,005 B2    5/2010   Ahsan et al.
(Continued)

FOREIGN PATENT DOCUMENTS

CN           104658940 A        5/2015

*Primary Examiner* — Long K Tran
(74) *Attorney, Agent, or Firm* — Thompson Hine LLP; Anthony Canale (57) ABSTRACT

Structures for testing a field effect-transistor or Kelvin field-effect transistor, and methods of forming a structure for testing a field-effect transistor or Kelvin field-effect transistor. The structure includes a device-under-testing that has one or more source/drain regions and a first metallization level arranged over the device-under-testing. The first metallization level includes one or more first interconnect lines. The structure further includes a contact level having one or more first contacts arranged between the first metallization level and the device-under-testing. The one or more first contacts directly connect the one or more first interconnect lines with the one or more source/drain regions. The structure further includes a second metallization level arranged over the first metallization level. The second metallization level has a first test pad and one or more second interconnect lines connecting the one or more first interconnect lines with the first test pad.

17 Claims, 9 Drawing Sheets

(51) Int. Cl.
  *G01R 31/26* (2020.01)
  *H01L 23/528* (2006.01)
  *H01L 23/522* (2006.01)
(58) Field of Classification Search
  USPC .......................................................... 257/48
  See application file for complete search history.

(56) References Cited

U.S. PATENT DOCUMENTS

| | | | |
|---|---|---|---|
| 8,610,451 B2 * | 12/2013 | Ahsan | H01L 22/34 |
| | | | 257/48 |
| 2009/0002012 A1 * | 1/2009 | Doong | G01R 31/2853 |
| | | | 324/762.03 |
| 2016/0341786 A1 * | 11/2016 | Pileggi | G01R 31/2818 |
| 2018/0182677 A1 | 6/2018 | Csaszar | |

* cited by examiner

TEST STRUCTURES CONNECTED WITH THE LOWEST METALLIZATION LEVELS IN AN INTERCONNECT STRUCTURE

BACKGROUND

The present invention relates to semiconductor device fabrication and integrated circuits and, more specifically, to structures for testing a field effect-transistor or Kelvin field-effect transistor and methods of forming a structure for testing a field-effect transistor or Kelvin field-effect transistor.

Test structures can be used to test for manufacturing variations in integrated circuit structures, such as manufacturing variations relating to contacts and vias that are coupled with the gates, sources, and drains of field-effect transistors. Test structures may be formed at various locations across a wafer and may be used to test the resistance response of a contact or a via in a device-under-testing. Current is supplied via a pair of connections (i.e., current leads) to the test structure and a voltage drop occurs that allows the impedance (e.g., resistance) to be measured according to Ohm's law. A pair of sense connections (i.e., voltage leads) are provided in proximity to the target impedance and may be used in measuring the voltage drop across the device under testing.

Improved structures for testing a field effect-transistor or Kelvin field-effect transistor and methods of forming a structure for testing a field-effect transistor or Kelvin field-effect transistor are needed.

SUMMARY

In an embodiment of the invention, a structure includes a device-under-testing that has one or more source/drain regions and a first metallization level arranged over the device-under-testing. The first metallization level includes one or more first interconnect lines. The structure further includes a contact level having one or more first contacts arranged between the first metallization level and the device-under-testing. The one or more first contacts directly connect the one or more first interconnect lines with the one or more source/drain regions. The structure further includes a second metallization level arranged over the first metallization level. The second metallization level has a first test pad and one or more second interconnect lines connecting the one or more first interconnect lines with the first test pad.

In an embodiment of the invention, a method includes forming a device-under-testing that has one or more source/drain regions, forming one or more first contacts directly connected with the one or more source/drain regions, and forming a first metallization level arranged over the device-under-testing. The first metallization level includes one or more first interconnect lines. The one or more first contacts directly connect the one or more first interconnect lines with the one or more source/drain regions. The method further includes forming a second metallization level arranged over the first metallization level. The second metallization level includes a first test pad and one or more second interconnect lines connecting the one or more first interconnect lines with the first test pad.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals are used to indicate like features in the various views.

DETAILED DESCRIPTION

Figure 1:
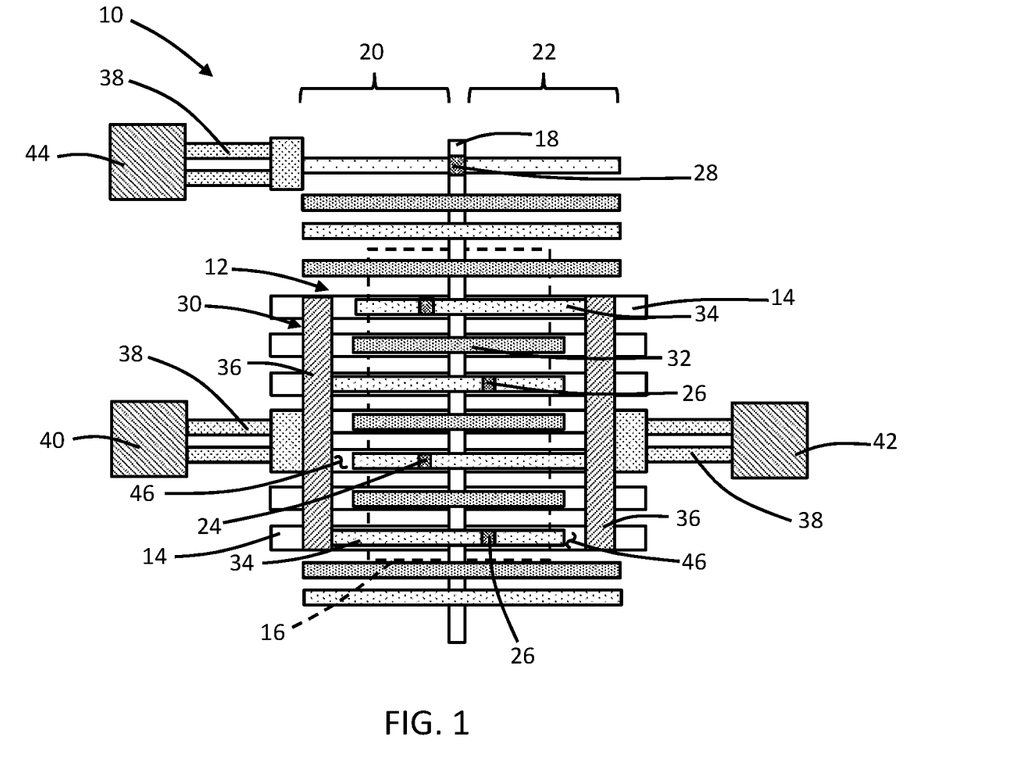
FIGS. 1-4 are schematic top views of test structures in accordance with embodiments of the invention.

With reference to FIG. 1 and in accordance with embodiments of the invention, a test structure 10 includes a field-effect transistor 12 (i.e., a device-under-testing) with fins 14 that are arranged over an active device region 16 and a gate structure 18 that transversely overlaps with the fins 14. The field-effect transistor 12 is fabricated by front-end-of-line processing, such as by complementary-metal-oxide semiconductor (CMOS) processing. The fins 14 are arranged over, and project upwardly away from, the active device region 16. The fins 14 and the active device region 16 may be composed of a single-crystal semiconductor material, such as single-crystal silicon. The fins 14 may be formed by patterning the active device region 16 with lithography and etching processes or by a self-aligned multi-patterning process, and then cutting the patterned fins 14 into given lengths.

The field-effect transistor 12 may include source/drain regions in the form of drain regions 20 and source regions 22. The drain regions 20 and the source regions 22 may include doped semiconductor material of the fins 14 and doped epitaxial semiconductor material grown from the fins 14. The gate structure 18 of the field-effect transistor 12 is arranged laterally between the drain regions 20 and the source regions 22. Specifically, the drain regions 20 are laterally arranged on one side of the gate structure 18 and the source regions 22 are laterally arranged on an opposite side of the gate structure 18. The gate structure 18 may include a conductor, such as doped polysilicon or a metal, defining a gate electrode and a gate dielectric layer arranged between the exterior surfaces of the fins 14 and the gate electrode.

Drain contacts 24, source contacts 26, and a gate contact 28 are formed by middle-of-line (MOL) processing in a dielectric layer (not shown) of a contact level and provide vertical interconnects to the drain regions 20, source regions 22, and gate structure 18. The drain contacts 24 respectively extend in a vertical direction to the drain regions 20 associated with different fins 14 of the field-effect transistor 12. The source contacts 26 respectively extend in the vertical direction to the source regions 22 associated with different fins 14 of the field-effect transistor 12. The contact 28 extends in the vertical direction to the gate electrode of the gate structure 18.

A metallization level 30 is formed by back-end-of-line processing over the field-effect transistor 12 and the contact level including contacts 24, 26, 28. The metallization level 30 is part of an interconnect structure that may include vertical interconnects in additional metallization levels arranged in a stack over the metallization level 30. The metallization level 30 is an M0 metallization level that is the closest of the multiple metallization levels in the vertical stacking to the field-effect transistor 12. The metallization level 30 includes interconnect lines that are arranged in a pattern of non-mandrel lines 32, mandrel lines 34, and transverse mandrel lines 36. Each of the transverse mandrel lines 36 physically and electrically connects one or more of the mandrel lines 34 together. The metallization level 30 further includes mandrel connections 38 and test pads 40, 42, 44 that are individually connected with one of the mandrel connections 38. The depiction of the contacts 24, 26, 28 is for purposes of illustration with an understanding that the contact level is arranged between the metallization level 30 and the field-effect transistor 12

Different sets of the mandrel lines 34 of the metallization level 30 are connected with one of the transverse mandrel lines 36, and each of the mandrel connections 38 may include one or more interconnect lines that extend from one of the transverse mandrel lines 36 to either the test pad 40 or the test pad 42. The test pad 40 is connected with the source regions 22 of the field-effect transistor 12, and the test pad 42 is connected with the drain regions 20 of the field-effect transistor 12. The mandrel lines 34 that are connected with the source regions 22 include cuts, diagrammatically shown by reference numeral 46, that disconnect these mandrel lines 34 from the transverse mandrel line 36 connected with the test pad 42. Similarly, the mandrel lines 34 that are connected with the drain regions 20 also include the cuts 46 that disconnect these mandrel lines 34 from the transverse mandrel line 36 connected with the test pad 40. The cuts 46 may be provided during multiple patterning by cutting the sacrificial mandrels used to form the mandrel lines 34.

In the representative embodiment, the non-mandrel lines 32 of the metallization level 30 are not connected by contacts with either the drain regions 20 or source regions 22 of the field-effect transistor 12. The non-mandrel lines 32 are spaced at their ends from the transverse mandrel lines 36 by a distance related to the thickness of sidewall spacers used during multiple patterning, and may further include non-mandrel cuts (not shown) adjacent to their opposite ends. The test pad 44 is connected by contact 28 and one of the mandrel connections 38 with the gate structure 18.

The source regions 22 associated with the fins 14 of the field-effect transistor 12 may be connected by the source contacts 26 with the mandrel lines 34 that are connected with one of the transverse mandrel lines 36, which is in turn connected by one of the mandrel connections 38 with the test pad 40. The source contacts 26 provide respective vertical interconnections between the mandrel lines 34 and the source regions 22. The mandrel lines 34 associated with the test pad 40 are directly connected by the source contacts 26 with the source regions 22 of the field-effect transistor 12. In an embodiment, each of the mandrel lines 34 associated with the test pad 40 is directly connected by only one of the source contacts 26 with the source region 22 of the field-effect transistor 12.

The drain regions 20 associated with the fins 14 of the field-effect transistor 12 may be connected by the drain contacts 24 with the mandrel lines 34 that are connected with one of the transverse mandrel lines 36, which is in turn connected by one of the mandrel connections 38 with the test pad 42. The drain contacts 24 provide respective vertical interconnections between the mandrel lines 34 and the drain regions 20. The mandrel lines 34 associated with the test pad 42 are directly connected by the drain contacts 24 with the drain regions 20. In an embodiment, each of the mandrel lines 34 associated with the test pad 42 is directly connected by only one of the drain contacts 24 with the drain region 20.

The non-mandrel lines 32, mandrel lines 34, and transverse mandrel lines 36 of the metallization level 30 may be formed by a multiple-patterning process, such as a self-aligned double patterning (SADP) process. In that regard, mandrels may be formed by patterning a layer of a sacrificial material with lithography and etching processes. The etch mask used during patterning to form the mandrels may include cuts that are transferred to the mandrels as mandrel cuts that are arranged along the length of the mandrels. These mandrel cuts are transferred to the mandrel lines 34 to provide the cuts 46 that disconnect the mandrel lines 34 from one or the other of the transverse mandrel lines 36. A conformal dielectric layer is formed over the mandrels and over the parallel linear spaces between the mandrels. A block mask may be formed over portions of the conformal dielectric layer within the parallel spaces and these masked portions of the conformal dielectric layer may subsequently define non-mandrel cuts. The non-mandrel cuts are transferred to the non-mandrel lines to provide discontinuities between the opposite ends of the non-mandrel lines 32 and the transverse mandrel lines 36. Sidewall spacers are formed on the mandrels by an etching process, such as a reactive ion etching process, that shapes the conformal dielectric layer with the block mask present. The conformal dielectric layer is removed from the parallel spaces arranged between adjacent spacer-clad mandrels during the etching process. These parallel spaces subsequently define locations for the non-mandrel lines 32. After the mandrels are pulled from their positions between the sidewall spacers, the pattern is transferred to a hardmask and subsequently transferred from the hardmask to an interlayer dielectric layer (not shown) arranged over the field-effect transistor 12 as trenches. The trenches are subsequently filled with conductor to define the non-mandrel lines 32, mandrel lines 34, and transverse mandrel lines 36. The mandrel connections 38 and test pads 40, 42, 44 may be formed during the multiple patterning process and/or by patterning a conductor layer with lithography and etching processes.

The test pad 40 may be used to perform testing of the source contacts 26 and the source regions 22 of the field-effect transistor 12. The test pad 42 may be used to perform testing of the drain contacts 24 and the drain regions 20 of the field-effect transistor 12. The test pad 44 may be used to perform testing of the gate contact 28 and the gate structure 18. During testing, the currents introduced and received at the test pads 40, 42, 44 travel to and from the gate defined by the gate structure 18 through the gate contact 28, the drain defined by the drain regions 20 through the drain contacts 24, and the source defined by the source regions 22 through the source contacts 26 without passing through interconnects in any of the overlying metallization levels, such as interconnects in the M1 metallization level positioned immediately over the metallization level 30 and the vias connecting the metallization level 30 with the immediately-overlying M1 metallization level. Testing via the metallization level 30, instead of overlying metallization levels of the interconnect structure, may minimize the contribution to the impedance (e.g., electrical resistance) from interconnects in those overlying metallization levels to determinations of contact impedance. The testing process may be accelerated in comparison with conventional testing because testing is performed after forming the metallization level 30, instead of after forming at least the nearest overlying M1 metallization level. During technology development and manufacturing, feedback from such test structures 10 earlier in the process cycle can assist in reducing the fabrication cost of CMOS chips through earlier identification of failures.

Figure 2:
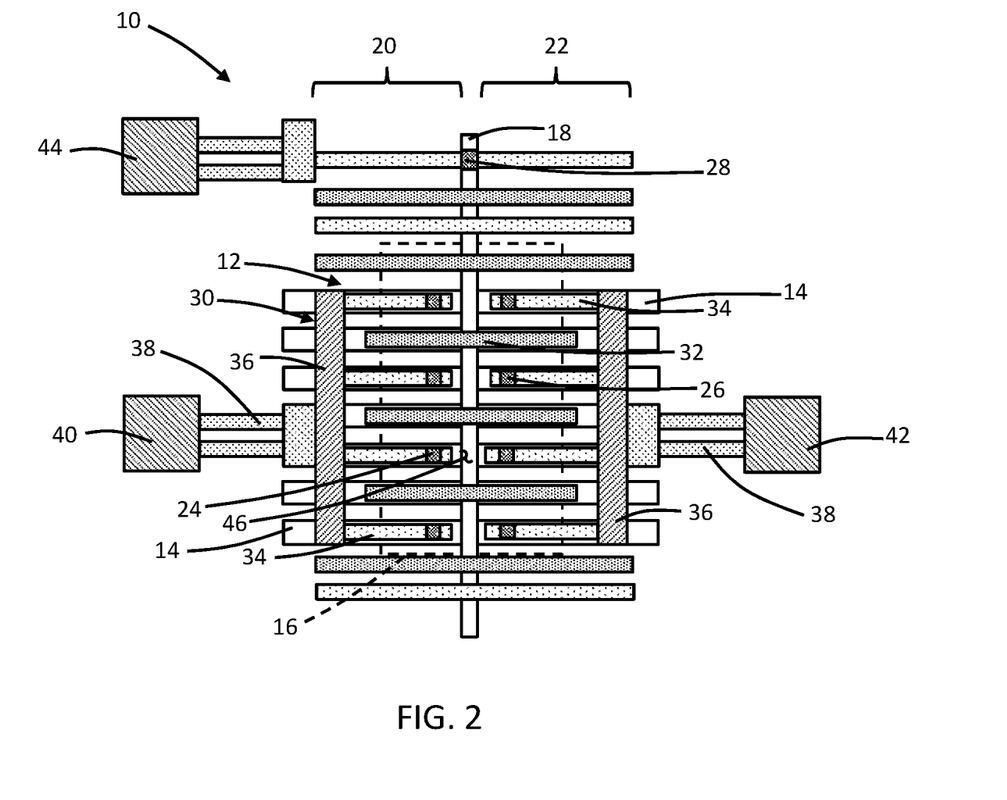

With reference to FIG. 2 and in accordance with alternative embodiments of the invention, each of the mandrel lines 34 of the metallization level 30 may be divided by the cuts 46 such that a section of each mandrel line 34 is arranged on one side of the gate structure 18 and another section of each mandrel line 34 is arranged on one side of the gate structure 18. The cuts 46 may be centrally arranged, such as a central arrangement of cuts 46 directly over the gate structure 18. The sections of all mandrel lines 34 on one side of the cuts 46 are connected by the mandrel connection 38 with the test pad 40. These sections of the mandrel lines 34 are connected by the drain contacts 24 with the drain regions 20. The sections of all mandrel lines 34 on the opposite side of the cuts 46 are connected by the mandrel connection 38 with the test pad 42. These sections of the mandrel lines 34 are connected by the source contacts 26 with the source regions 22 of the field-effect transistor 12. In an embodiment, the test structure 10 may be used in connection with a device-under-testing that is a long-channel field-effect transistor.

Figure 3:
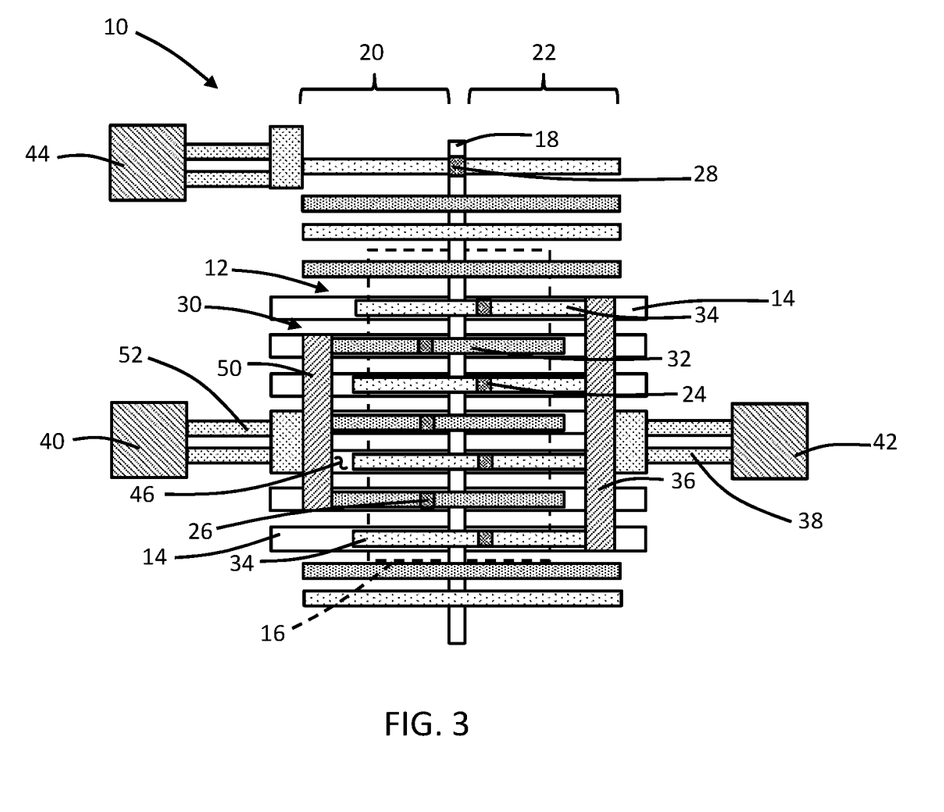

With reference to FIG. 3 and in accordance with alternative embodiments of the invention, the non-mandrel lines 32 of the metallization level 30 may also be included as active features of the test structure 10 instead of being passive features, and both the non-mandrel lines 32 and mandrel lines 34 may be used in constructing the test structure 10. For example, the non-mandrel lines 32 may be connected by a transverse non-mandrel line 50 and a non-mandrel connect 52 with the test pad 40. The non-mandrel lines 32 are connected by the source contacts 26 with the source regions 22 associated with the fins 14 of the field-effect transistor 12. The test structure 10 uses a mixture of mandrel and non-mandrel lines as the mandrel lines 34 are connected by the mandrel connection 38 with the test pad 42, and the mandrel lines 34 are connected by the drain contacts 24 with the drain regions 20 associated with the fins 14 of the field-effect transistor 12.

Figure 4:
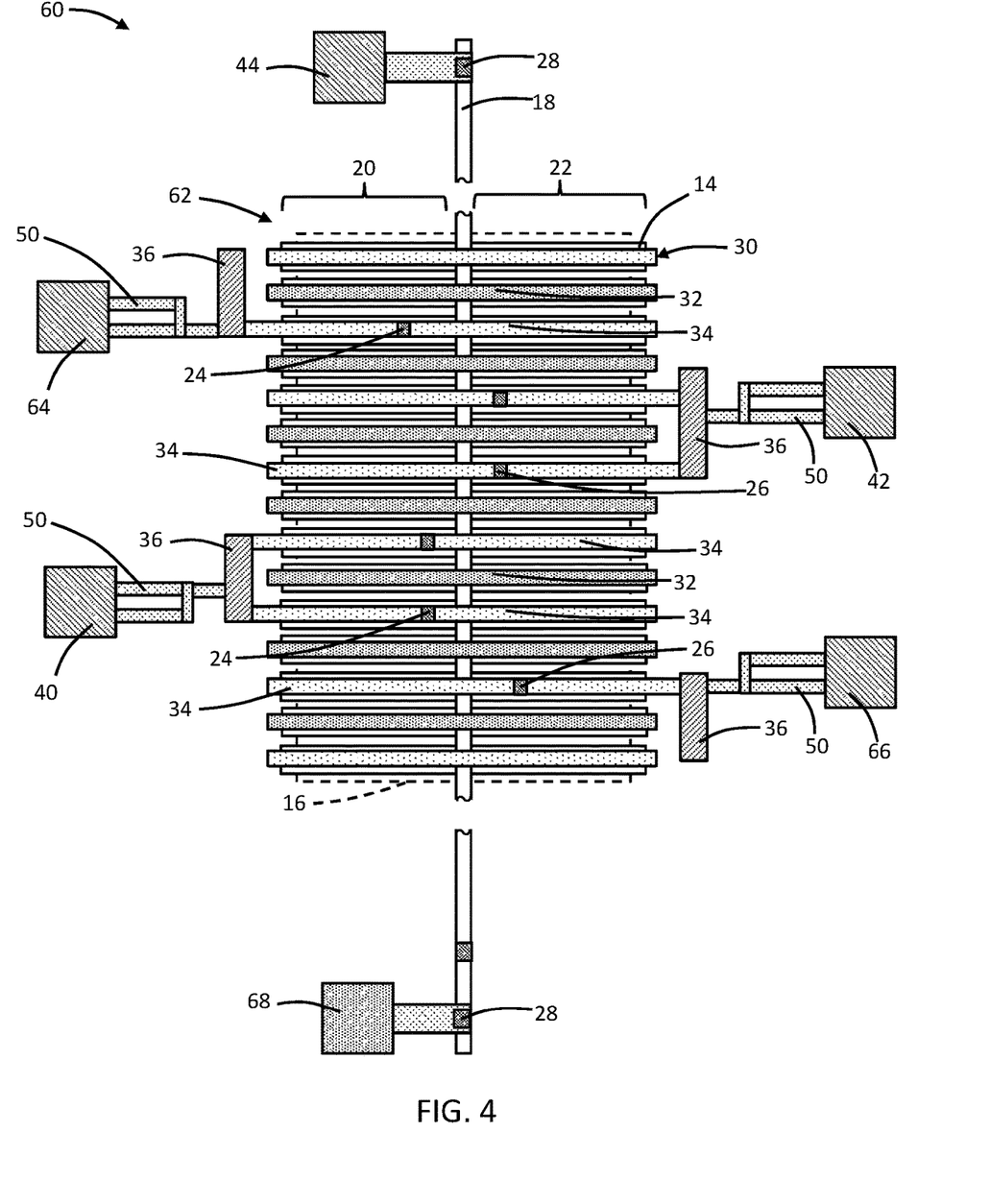

With reference to FIG. 4 and in accordance with alternative embodiments of the invention, a test structure 60 includes a Kelvin field-effect transistor (i.e., device-under-testing), generally indicated by reference numeral 62, as well as the non-mandrel lines 32, mandrel lines 34, transverse mandrel lines 36, and mandrel connections 38 of the metallization level 30. The metallization level 30 further includes the test pads 40, 42, 44 and additional test pads 64, 66, 68. The Kelvin field-effect transistor 62 includes the fins 14 that are arranged over the active device region 16 and the gate structure 18 that transversely overlaps with the fins 14, as well as drain regions 20 and source regions 22 of the field-effect transistor 12. An additional active region with fins (not shown) may be arranged between the active device region 16 and the test pad 44, and an additional active region with fins (not shown) may be arranged between the active device region 16 and the test pad 68.

Drain regions 20 associated with multiple fins 14 are connected with the test pad 40, as described above. Source regions 22 associated with multiple fins 14 are connected with the test pad 42, as described above. In an alternative embodiment, the drain region 20 associated with only one of the fins 14 may be connected with the test pad 40, and the source region 22 associated with only one of the fins 14 may be connected with the test pad 42.

Each drain region 20 may be connected by the drain contact 24 with the overlying mandrel line 34 that is connected with one of the transverse mandrel lines 36, which is in turn connected by one of the mandrel connections 38 with the test pad 64. The drain contact 24 provides a vertical interconnection between the mandrel line 34 and the drain region 20 associated with the fin 14. Specifically, the mandrel line 34 associated with the test pad 64 is directly connected by the drain contact 24 with the drain region 20 associated with one of the fins 14.

Each source region 22 may be connected by the source contact 26 with the overlying mandrel line 34 that is connected with one of the transverse mandrel lines 36, which is in turn connected by one of the mandrel connections 38 with the test pad 66. The source contact 26 provides a vertical interconnection between the mandrel line 34 and the source region 22 of the fin 14. Specifically, the mandrel line 34 associated with the test pad 66 is directly connected by the source contact 26 with the source region 22 of one of the fins 14.

The test pad 40 and test pad 64 may be jointly used to perform testing of the drain regions 20 of the Kelvin field-effect transistor 62. The test pad 42 and test pad 66 may be jointly used to perform testing of the source regions 22 of the Kelvin field-effect transistor 62. The test pad 44 and the test pad 68 may be jointly used to perform testing of the gate structure 18 of the Kelvin field-effect transistor 62.

Figure 4A:
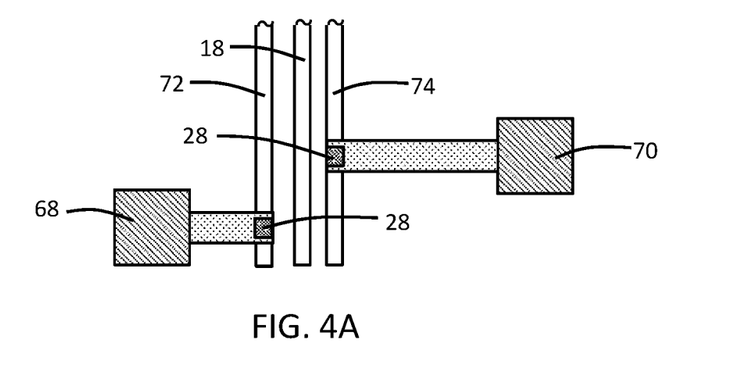
FIG. 4A is a schematic top view of a portion of the test structure of FIG. 4 in accordance with alternative embodiments of the invention.

With reference to FIG. 4A and in accordance with alternative embodiments of the invention, the Kelvin field-effect transistor 62 may include an additional test pad 70 and additional gate structures 72, 74 that are aligned parallel with the gate structure 18 and that also transversely overlap with the fins 14. The test pads 40, 64, as well as the test pad 68, may be used to perform testing of the gate structure 72 and drain regions 20 of the Kelvin field-effect transistor 62. The test pad 42 and test pad 66, as well as the test pad 70, may be used to perform Kelvin testing of the gate structure 74 and source regions 22 of the Kelvin field-effect transistor 62. In an embodiment, the Kelvin field-effect transistor 62 may include exactly seven (7) test pads 40, 42, 44, 64, 66, 68, 70.

Figure 5:
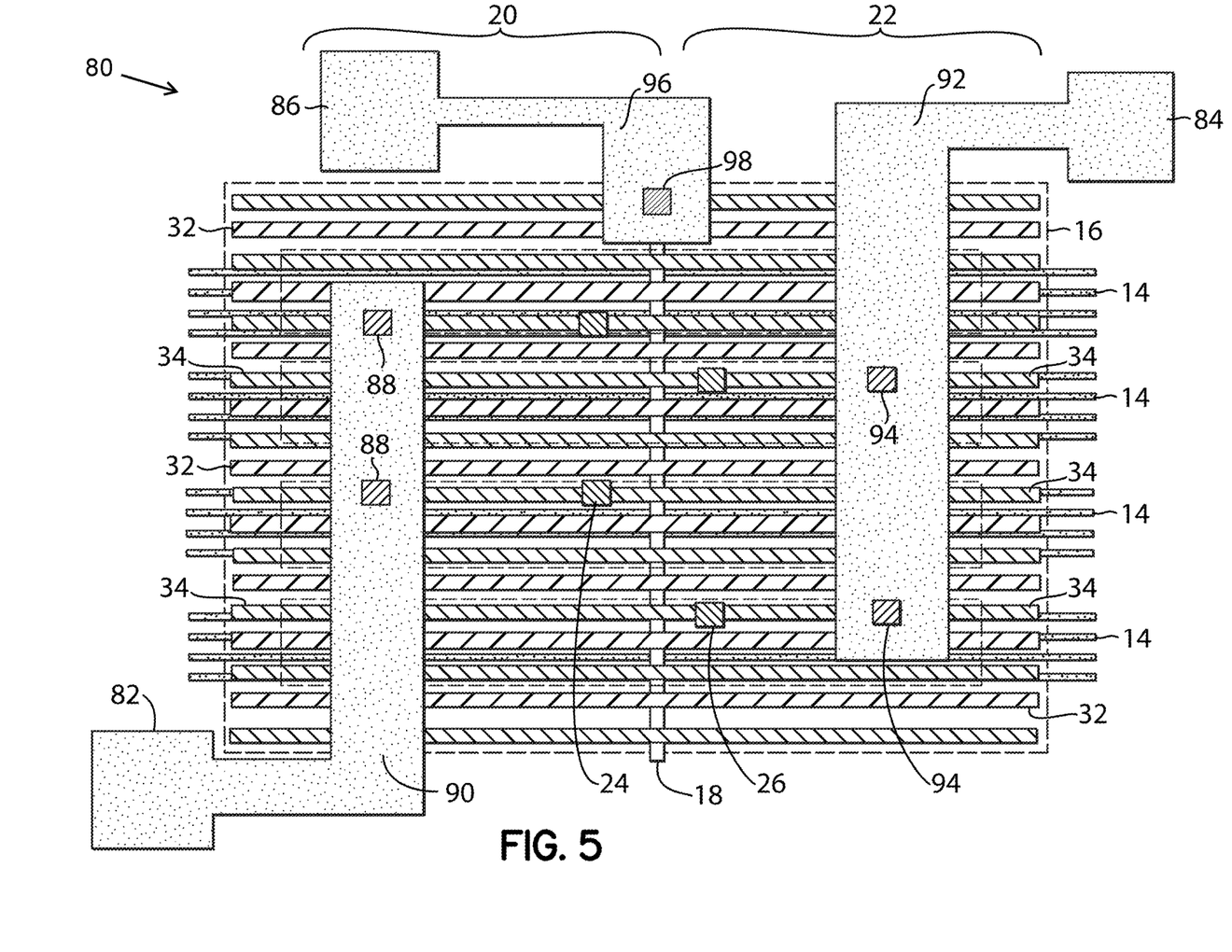
FIGS. 5-9 are schematic top views of test structures in accordance with embodiments of the invention.

With reference to FIG. 5 in which like reference numerals refer to like features in FIG. 1 and in accordance with alternative embodiments of the invention, the test structure 10 is formed without transverse mandrel lines 36, mandrel connections 38, or test pads 40, 42, and the cuts may be omitted from the mandrel lines 34 and non-mandrel lines 32. A metallization level 80 is formed over the metallization level 30 that includes a test pad 82 coupled with the drain regions 20, a test pad 84 coupled with the source regions 22, and a test pad 86 coupled with the gate structure 18. In an embodiment, the metallization level 80 may be the M1 metallization level of the interconnect structure such that the metallization level 30 is the only metallization level of the interconnect structure arranged between the metallization level 80 and the field-effect transistor 12. The metallization level 80 includes an L-shaped interconnect line 90 that extends from the test pad 82 and that is connected with one or more of the mandrel lines 34 (which are connected with the drain regions 20) by vias 88 in an intervening via level. The metallization level 80 further includes an L-shaped interconnect line 92 that extends from the test pad 84 and that is connected with one or more of the mandrel lines 34 (which are connected with the source regions 22) by vias 94 in the intervening via level. The metallization level 80 further includes an L-shaped interconnect line 96 that extends from the test pad 86 and that is connected with the gate structure 18 by a via 98 in the intervening via level. The interconnect lines 90, 92, 94, due to the L-shapes, are routed to locate the test pads 82, 84, 86 outside of the active device regions 16.

The metallization level 80 may be formed by lithography and etching processes that pattern a deposited layer of a conductor, such as copper. In an embodiment, the test pads 82, 84 may be arranged in an ANA or buffer region, which may be included in an integrated circuit structure to isolate active device regions from one another and to ensure that the active device regions remain thermally and electromagnetically isolated from one another. The depiction of the vias 88, 94, 98 is for purposes of illustration with an understanding that the via level is arranged between the metallization level 30 and the metallization level 80.

Figure 6:
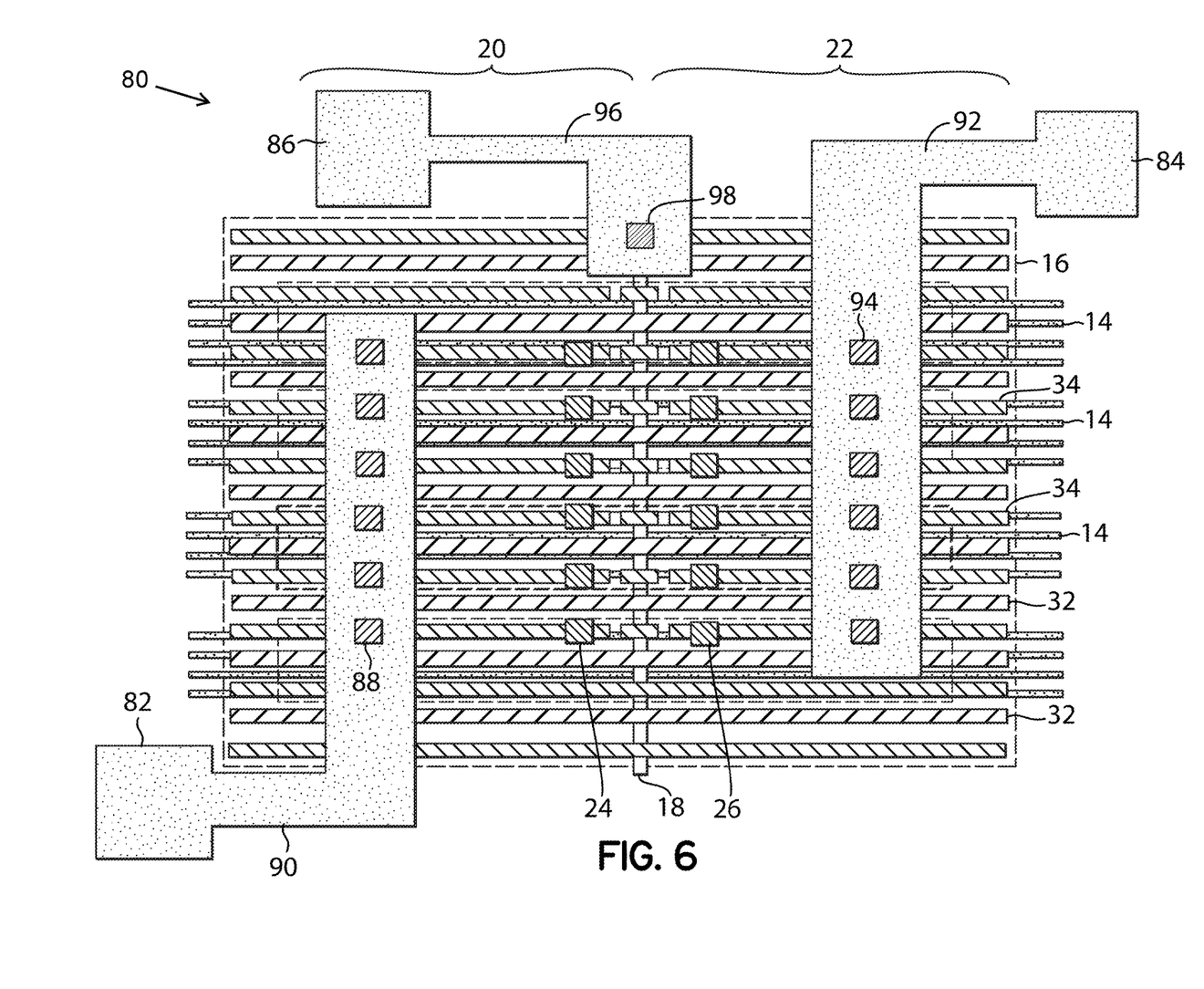

With reference to FIG. 6 in which like reference numerals refer to like features in FIG. 5 and in accordance with alternative embodiments of the invention, the mandrel lines 34 in the metallization level 30 may be divided by cuts that are arranged on opposite sides of the gate structure 18. The cuts permit each of the mandrel lines 34 to be connected to the drain region 20 by one of the drain contacts 24 and each of the mandrel lines 34 to be connected to the source region 22 by one of the source contacts 26. The result is that each mandrel line 34 may be connected to both of the test pads 82, 84 with the cuts providing electrical discontinuities between the connections with the source region 22 and the connections with the drain region 20.

Figure 7:
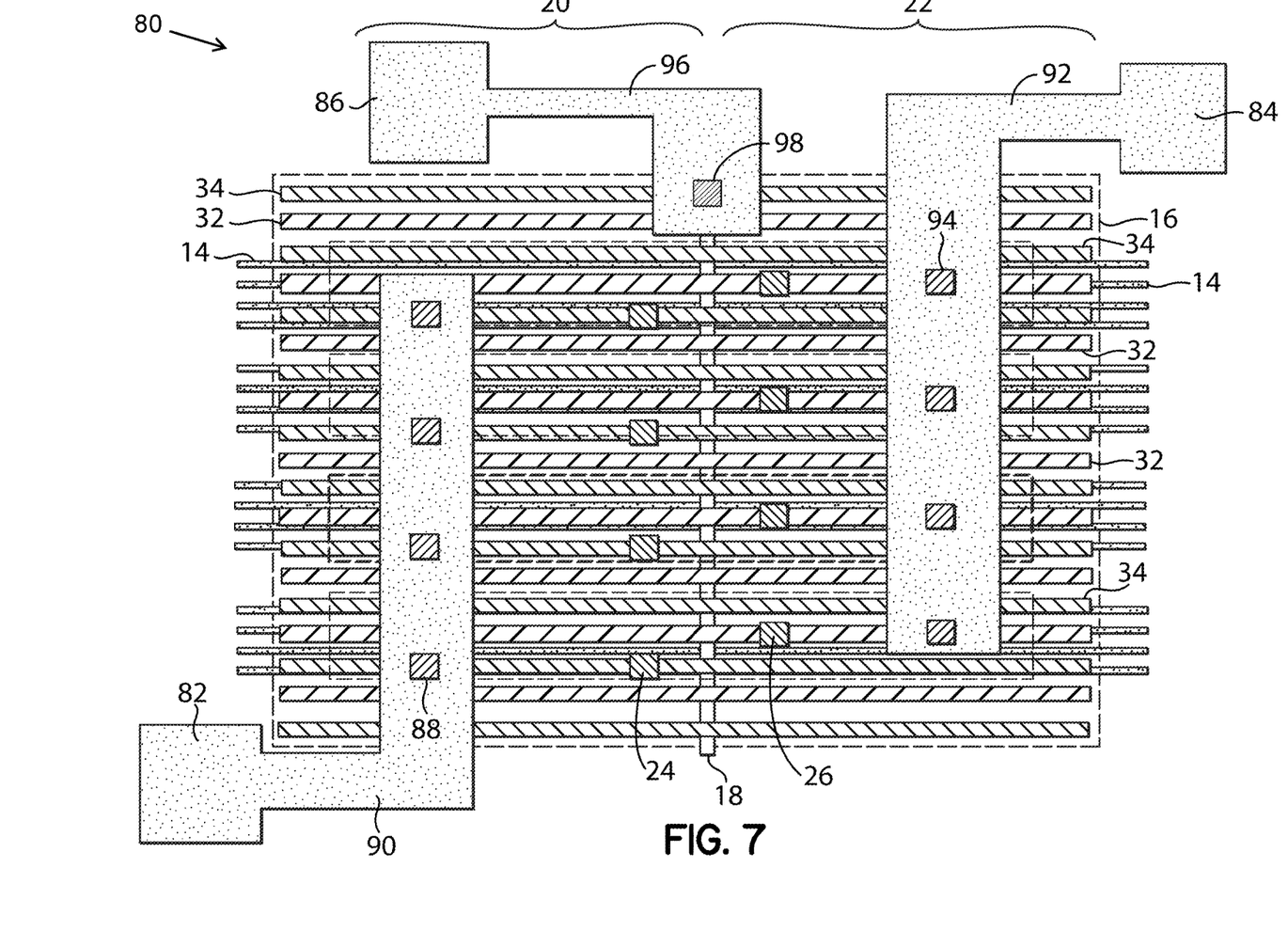

With reference to FIG. 7 in which like reference numerals refer to like features in FIG. 5 and in accordance with alternative embodiments of the invention, the mandrel lines 34 in the metallization level 30 may be connected by the drain contacts 24 with the drain regions 20, and the non-mandrel lines 32 in the metallization level 30 may be connected by the source contacts 26 with the source regions 22. The test pad 82 is connected by the vias 88 with the mandrel lines 34, and the test pad 84 is connected by the vias 94 with the non-mandrel lines 32.

Figure 8:
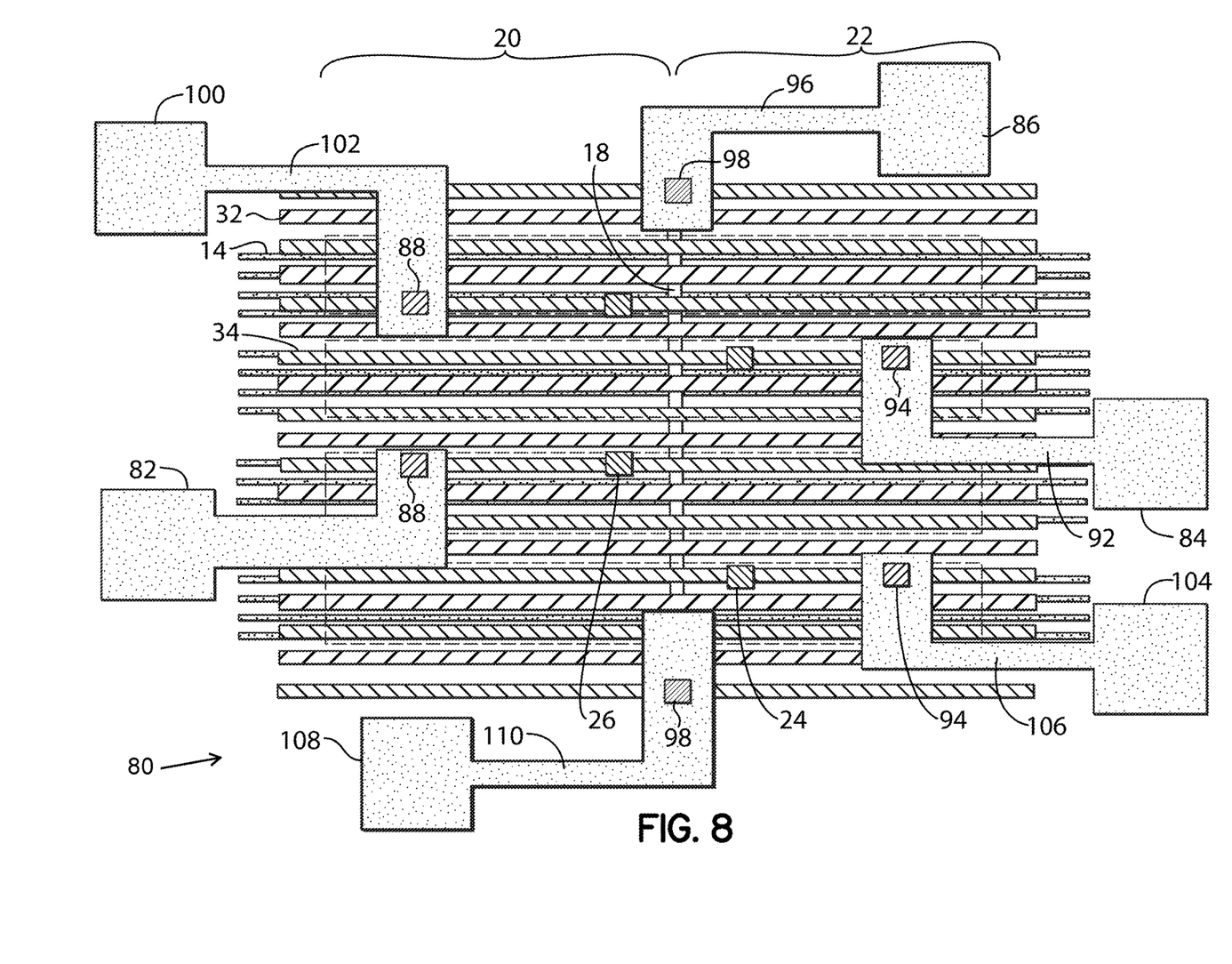

With reference to FIG. 8 in which like reference numerals refer to like features in FIG. 5 and in accordance with alternative embodiments of the invention, the device-under-testing may be a Kelvin field-effect transistor 62, and the metallization level 80 over the Kelvin field-effect transistor 62 may further include a test pad 100 and an L-shaped interconnect 102 that extends from the test pad 100. The L-shaped interconnect 102 is connected with one of the mandrel lines 34 (which is connected with the drain region 20) by one of the vias 88 in the intervening via level. The metallization level 80 further includes a test pad 104 and an L-shaped interconnect 106 that extends from the test pad 104. The L-shaped interconnect 106 is connected with one of the mandrel lines 34 (which is connected with the source region 22) by one of the vias 94 in the intervening via level. The metallization level 80 further includes a test pad 108 and an L-shaped interconnect 110 that extends from the test pad 108. The L-shaped interconnect 110 is connected with the gate structure 18 by one of the vias 94 in the intervening via level. The L-shaped interconnects 102, 106, 110 provide additional interconnect lines that are used to respectively couple the test pads 100, 104, 108 with the Kelvin field-effect transistor 62.

The test pad 82 and test pad 100 may be jointly used to perform testing of the drain regions 20 of the Kelvin field-effect transistor 62. The test pad 84 and test pad 104 may be jointly used to perform testing of the source regions 22 of the Kelvin field-effect transistor 62. The test pad 86 and the test pad 108 may be jointly used to perform testing of the gate structure 18 of the Kelvin field-effect transistor 62.

Figure 9:
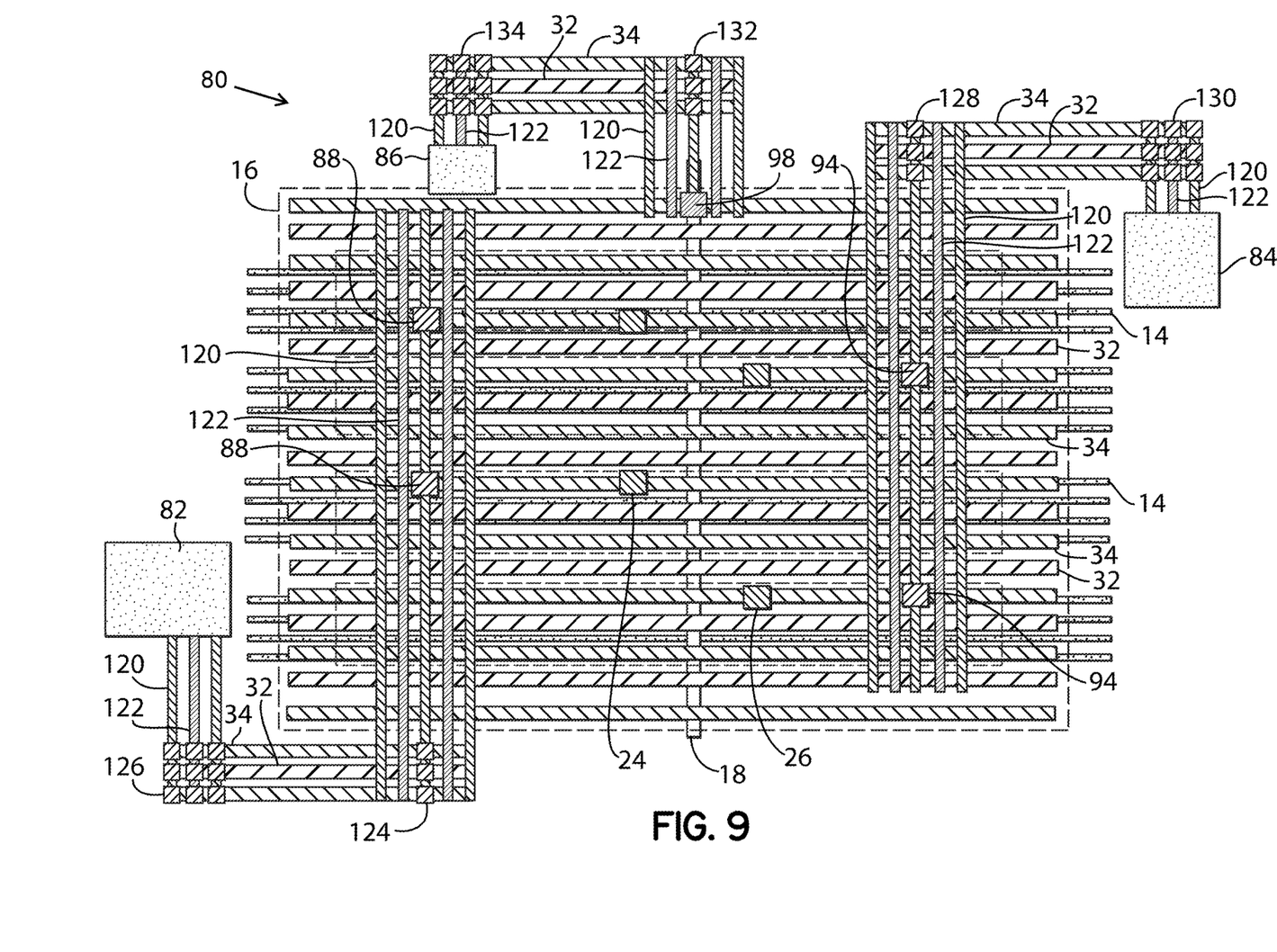

With reference to FIG. 9 in which like reference numerals refer to like features in FIG. 5 and in accordance with alternative embodiments of the invention, the metallization level 80 may include mandrel lines 120 and non-mandrel lines 122 that are aligned transverse to the mandrel lines 34 and the non-mandrel lines 32 in the metallization level 30. The mandrel lines 120 and non-mandrel lines 122 may be formed in the same manner as the mandrel lines 34 and non-mandrel lines 32. The mandrel lines 120 and non-mandrel lines 122 in the upper metallization level 80 are aligned transverse to the mandrel lines 34 and non-mandrel lines 32 in the lower metallization level 30.

One of the mandrel lines 120 is coupled by each of the vias 88 with mandrel lines 34, and these mandrel lines 34 are in turn each connected by one of the contacts 24 with one of the drain regions 20. This mandrel line 120 is connected by a set of vias 124 with non-mandrel lines 32 and mandrel lines 34 in the metallization level 30, which are in turn connected with a set of the mandrel lines 120 and non-mandrel lines 122 by a set of vias 126. The mandrel lines 120 and non-mandrel lines 122 in the set are connected with the test pad 82.

One of the mandrel lines 120 is coupled by the vias 94 with one of the mandrel lines 34 connected by one of the contacts 26 with one of the fins 14 in the source region 22. This mandrel line 120 is connected by a set of vias 128 with non-mandrel lines 32 and mandrel lines 34 in the metallization level 30, which are in turn connected with a set of the mandrel lines 120 and non-mandrel lines 122 by a set of vias 130. The mandrel lines 120 and non-mandrel lines 122 in the set are connected with the test pad 84.

The gate structure 18 is coupled by the via 98 with one of the mandrel lines 120. This mandrel line 120 is connected by a set of vias 132 with non-mandrel lines 32 and mandrel lines 34 in the metallization level 30, which are in turn connected with a set of the mandrel lines 120 and non-mandrel lines 122 by a set of vias 134. The mandrel lines 120 and non-mandrel lines 122 in the set are connected with the test pad 86.

The networks of mandrel lines and non-mandrel lines, in each instance, collectively provide additional interconnect lines that are used to respectively couple the test pads 100, 104, 108 with the Kelvin field-effect transistor 62.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
   a device-under-testing including one or more first source/drain regions;
   a first metallization level arranged over the device-under-testing, the first metallization level including one or more first interconnect lines;
   a contact level including one or more first contacts arranged between the first metallization level and the device-under-testing, the one or more first contacts directly connecting the one or more first interconnect lines with the one or more first source/drain regions;
   a second metallization level arranged over the first metallization level, the second metallization level including a first test pad and one or more second interconnect lines connecting the one or more first interconnect lines with the first test pad; and
   a via level including a plurality of vertical interconnects connecting the one or more first interconnect lines with the one or more second interconnect lines,
   wherein each of the one or more first interconnect lines is connected with one of the one or more first source/drain regions by only one of the one or more first contacts.

2. The structure of claim 1 wherein the first metallization level is one of a plurality of metallization levels in an interconnect structure, and the first metallization level is closest to the device-under-testing among the plurality of metallization levels.

3. The structure of claim 1 wherein the first metallization level and the second metallization level are included in an interconnect structure, and the first metallization level is closer to the device-under-testing than the second metallization level.

4. The structure of claim 1 wherein the first test pad is located in a buffer region of the second metallization level.

5. The structure of claim 1 wherein the one or more second interconnect lines include a section that is aligned transverse to the one or more first interconnect lines.

6. The structure of claim 1 wherein the one or more second interconnect lines include a first mandrel line connected with the one or more first interconnect lines and a second mandrel line connected with the first test pad, and the first mandrel line and the second mandrel line are arranged transverse to the one or more first interconnect lines.

7. The structure of claim 6 wherein the one or more first interconnect lines include a third mandrel line connecting the first mandrel line with the second mandrel line.

8. The structure of claim 1 wherein the one or more first interconnect lines are arranged directly over the device-under-testing.

9. The structure of claim 1 wherein the first metallization level includes a transverse interconnect line arranged transverse to the one or more first interconnect lines, and each of the one or more first interconnect lines is directly connected with the transverse interconnect line.

10. The structure of claim 1 wherein the device-under-testing includes one or more second source/drain regions and a gate structure arranged between the one or more first source/drain regions and the one or more second source/drain regions, and the second metallization level includes a second test pad and one or more third interconnect lines connecting the one or more first interconnect lines with the second test pad.

11. The structure of claim 1 wherein the device-under-testing is a field-effect transistor.

12. The structure of claim 1 wherein the device-under-testing is a Kelvin field-effect transistor.

13. A method comprising:
   forming a device-under-testing that includes one or more first source/drain regions;
   forming one or more contacts directly connected with the one or more first source/drain regions;
   forming a first metallization level arranged over the device-under-testing, wherein the first metallization level includes one or more first interconnect lines, and the one or more contacts directly connect the one or more first interconnect lines with the one or more first source/drain regions;
   forming a second metallization level arranged over the first metallization level, wherein the second metallization level includes a first test pad and one or more second interconnect lines connecting the one or more first interconnect lines with the first test pad; and
   forming a via level including a plurality of vertical interconnects connecting the one or more first interconnect lines with the one or more second interconnect lines,
   wherein each of the one or more first interconnect lines is connected with one of the one or more first source/drain regions by only one of the one or more contacts.

14. The method of claim 13 wherein the first test pad is located in a buffer region of the second metallization level.

15. The method of claim 13 wherein the device-under-testing is a field-effect transistor.

16. The method of claim 13 wherein the device-under-testing is a Kelvin field-effect transistor.

17. The method of claim 13 wherein the device-under-testing includes one or more second source/drain regions and a gate structure arranged between the one or more first source/drain regions and the one or more second source/drain regions, and the second metallization level including a second test pad and one or more third interconnect lines connecting the one or more first interconnect lines with the second test pad.

* * * * *